United States Patent [19]

Baker

[11] 4,365,281

[45] Dec. 21, 1982

[54] PROTECTION CIRCUIT FOR SWITCHING TRANSISTORS SERIALLY CONNECTED BETWEEN A D.C. VOLTAGE SOURCE

[75] Inventor: Richard H. Baker, Bedford, Mass.

[73] Assignee: Reliance Electric Company, Cleveland, Ohio

[21] Appl. No.: 160,828

[22] Filed: Jun. 18, 1980

[51] Int. Cl.³ .............................................. H02H 9/04
[52] U.S. Cl. ......................................... 361/91; 361/98; 361/101
[58] Field of Search ................ 361/91, 101, 98, 79; 330/207 P, 298

[56] References Cited

U.S. PATENT DOCUMENTS

| | | | |
|---|---|---|---|
| 3,202,904 | 8/1965 | Madland | 361/91 X |
| 3,571,608 | 3/1971 | Hurd | 361/101 X |
| 3,582,713 | 6/1971 | Till | 361/79 |
| 3,900,800 | 8/1975 | Maltz | 330/207 P |
| 4,158,866 | 6/1979 | Baker | 361/92 |

*Primary Examiner*—Reinhard J. Eisenzopf
*Attorney, Agent, or Firm*—Allan M. Lowe

[57] ABSTRACT

A protection circuit for a switching amplifier having a plurality of serially stacked switching transistors includes a voltage breakdown device and a current responsive device for sensing the voltage developed between the emitter and collector electrodes of each conducting switching transistor. The base drive for any transistor is removed in response to Vce of a switching transistor exceeding a predetermined value.

22 Claims, 5 Drawing Figures

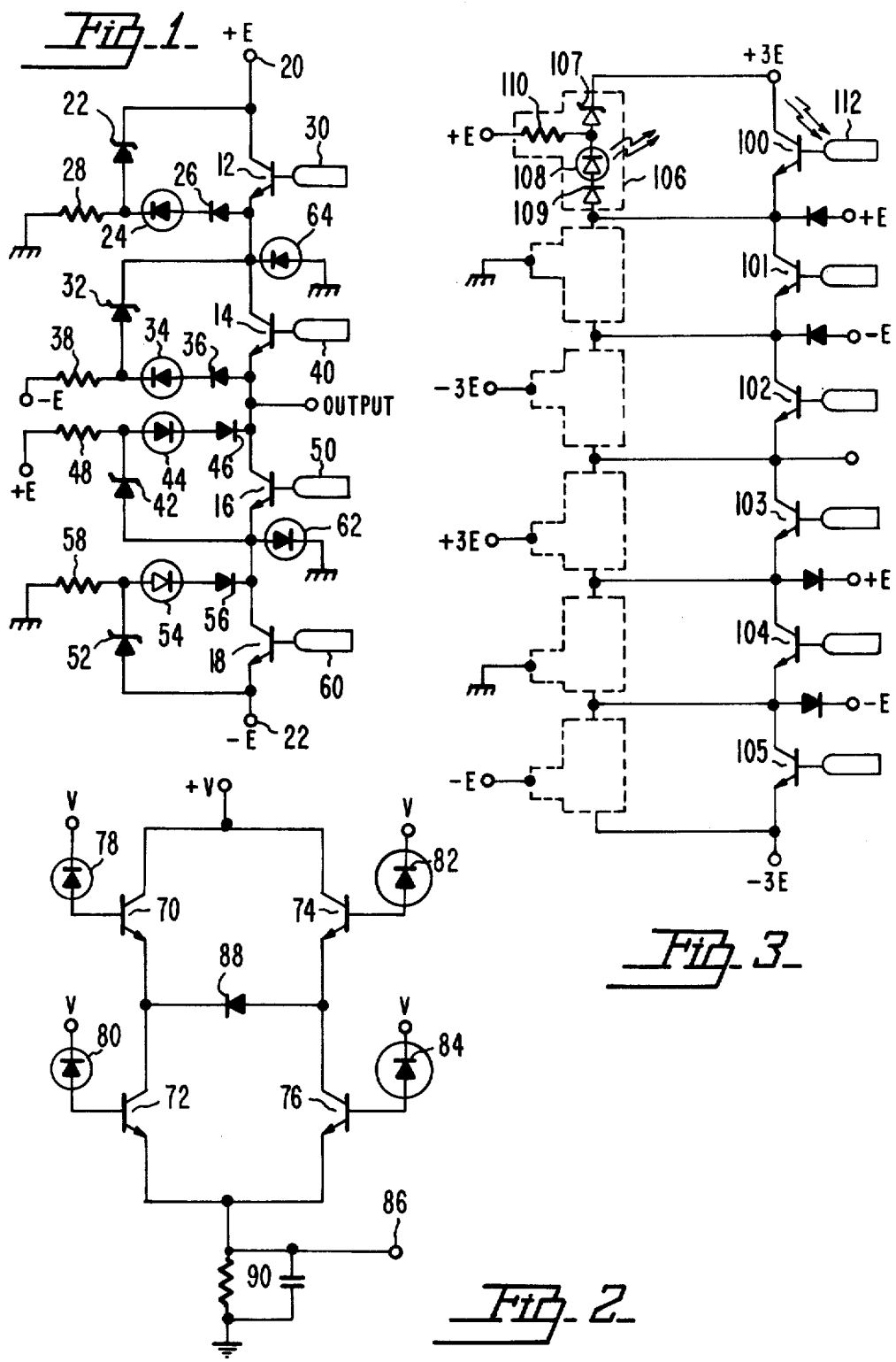

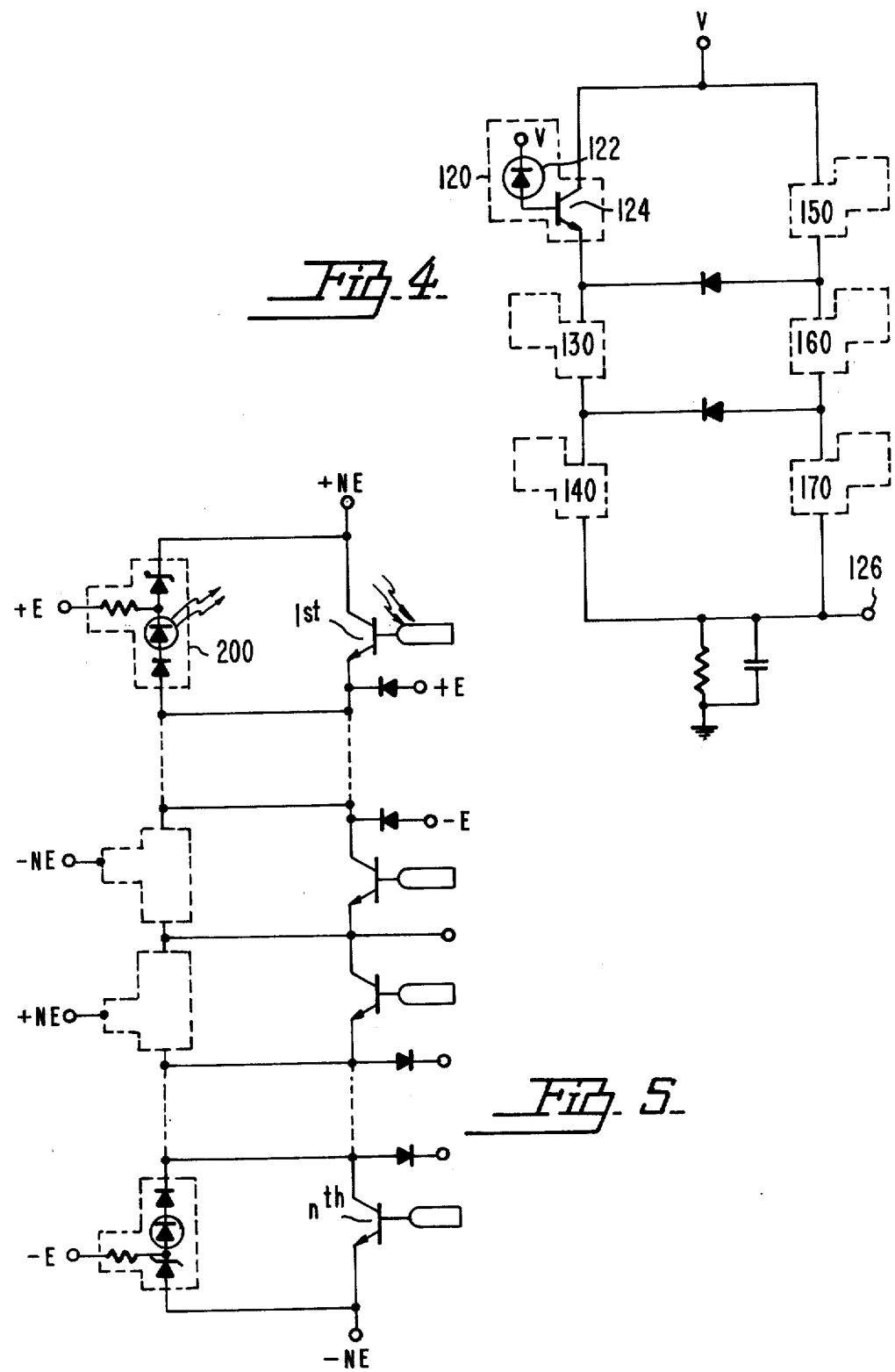

PROTECTION CIRCUIT FOR SWITCHING TRANSISTORS SERIALLY CONNECTED BETWEEN A D.C. VOLTAGE SOURCE

BACKGROUND OF THE INVENTION

The present invention relates generally to electrical circuitry which provides overload protection to associated circuitry components and more particularly to a circuit for overload protection of a plurality of cascode coupled switching transistors coupled between terminals of a d.c. voltage source.

In solid state switching circuits one or more power transistors are generally used as load switches. For reliable operation of the switching circuit, these transistors require protection from excessive power dissipation during fault of transient conditions. In circuitry having a plurality of transistors used as load switches coupled between terminals of a d.c. voltage source, the necessity for overload protection of the switching transistors is increased since failure of one transistor in likelihood would cause inoperability of the entire series circuit. The terms "fault" and "transient conditions" are here used herein in a general sense. The former denotes, for example, a condition in which associated circuitry supplies an improper voltage to the switching transistors or the output load is inappropriately shorted or opencircuited. Transient conditions (or transients) include a myriad of short time duration conditions which differ from the intended steady-state or normal operation of the circuit. A simple example is a switching circuit applying a sudden voltage or current change to an inductive or capacitive load. The associated circuitry experiences a momentarily large current or voltage. The switching circuitry may be designed to accommodate these conditions; however, such overdesign of circuit components typically results in a very inefficient circuit under normal operating conditions. As described in the applicant's earlier invention, U.S. Pat. No. 4,158,866, issued on June 19, 1979, assigned to the assignee of the present invention, a protection circuit which is responsive to transient or other overvoltages developed across the collector/emitter electrodes of a switching transistor may be used to prevent damage to the device.

Present technology power transistors for practical high power switching applications are generally limited to switching voltages below about ±600 volts. Series stacking the emitter collector paths of plural first thru $n^{th}$ switching transistors, as taught by U.S. Pat. No. 4,270,163 permits relatively high power switching application of voltage levels substantially exceeding the maximum safe switching voltage rating for individual switching transistors. Although the circuitry taught in the above referred application overcomes the problems associated with matching static and dynamic parameters of stacked switching transistors, such circuitry is vulnerable to the previously described transient and fault conditions, which may degrade or destroy the switching transistor and associated circuitry. The present invention provides a protection circuit for switching circuits having a plurality of stacked switching transistors. The inventive circuitry senses the voltage developed between the collector and emitter electrodes of each of the switching transistors. When this voltage exceeds a predetermined value for a conducting transistor, the protection circuit responds by removing the base drive from the transistor, rendering it substantially non-conductive.

The art has generally recognized the requirement for overload protection of switching devices. These references typically teach monitoring either the current flowing through the associated circuitry to be protected or the input voltage thereto. In U.S. Pat. No. 3,582,713, for example, excessive load current causes an increased voltage drop across a base to emitter path of a bypass transistor, which shunts current away from associated circuitry during overload conditions. Associated circuitry monitors the input voltage using a zener diode to bypass current away from the protected circuitry during overvoltage conditions. A second example of overvoltage protection is found in U.S. Pat. No. 3,571,608, where a circuit input voltage produces a base drive signal to turn on an associated bypass transistor, which turns off the switching transistor.

SUMMARY

In the present invention, a switching amplifier includes a plurality of switching transistors serially coupled in stacked relationship between an output terminal and at least one source voltage; the voltage between the output terminal and source exceeds the maximum voltage rating for any one of the individual switching devices. A protection circuit, including a voltage breakdown device and a current responsive device, senses the voltage developed between the emitter and collector electrodes of each switching transistor. Whenever a conducting switching transistor develops a collector to emitter voltage, Vce, in excess of a predetermined value, the respective protection circuit removes the base drive signal from the transistor, rendering it substantially non-conductive. Embodied in a series stacked array of switching transistors for switching voltages in excess of the individual switching transistor voltage rating, the present invention provides overload protection for each switching transistor, necessary for reliable operation of such circuitry in practical load applications.

BRIEF DESCRIPTION OF THE DRAWINGS

In the drawings, where like components bear common designation:

FIG. 1 is a schematic diagram of a cascode coupled switching circuit having two switching transistors coupled between an output terminal and voltage supply, each switching transistor having overload protection circuitry.

FIG. 2 is a schematic diagram of a logic controller circuit for use with the switching amplifier of FIG. 1.

FIG. 3 is a schematic diagram of a six transistor switching amplifier, each transistor having the protection circuitry of the present invention.

FIG. 4 is a schematic diagram of a logic controller circuit for use with the switching amplifier of FIG. 3.

FIG. 5 illustrates, in schematic form, transistor switching amplifier having cascoded transistors to the $n^{th}$, each of the transistors being provided with the protection circuitry of the present invention.

DETAILED DESCRIPTION OF THE INVENTION

By way of overview, the several embodiments of the present invention are first described in terms of circuit arrangement followed by a detailed discussion of the operation of the circuitry.

Referring to FIG. 1, there is shown a transistor switching circuit having first through fourth switching transistors, 12, 14, 16 and 18, respectively, serially connected in stacked arrangement between a first terminal 20 for receiving a first operating voltage +E, and a second terminal 22 for receiving a second operating voltage −E. An output terminal is connected to a common connection for the emitter and collector electrodes of the second and third switching transistors 14 and 16 respectively.

Referring to the first switching transistor 12, an overvoltage protection circuit includes voltage sensing means responsive to a voltage Vce developed between the collector and emitter electrodes of the switching transistor. The voltage sensing means includes a voltage breakdown zener diode 22 and current responsive device 24 comprising a light emitting diode and diode means 26. Device 24, the light emitting diode, and diode 26 are serially connected with each other between the emitter and collector electrodes of the first switching transistor. The common connection of the zener breakdown device 22 and current responsive device 24 is coupled through impedance 28 to a reference, ground potential. Controller logic means 30, coupled to the base electrode of switching transistor 12, selectively applies a drive signal to the transistor base electrode to drive the switching transistor into saturation (hereinafter turn-on condition), or clamps the transistor in a non-conductive state (hereinafter turned-off condition) by removing the drive signal. Aspects of the particular circuit arrangement and of the operation of the controller logic means are detailed hereinafter.

An overvoltage protection circuit for switching transistor 14 comprises voltage responsive means substantially similar to that described heretofor for first switching means 12, including voltage breakdown zener diode 32, current responsive device 34 comprising a light emitting diode and further diode means 36. Diode 32, device 34 and diode 36 are serially coupled between the emitter and collector electrodes of switching transistor 14. The common connection of the zener breakdown device 32 and current responsive device 34 is coupled through impedance 38 to reference potential −E. As described in relation to the first switching transistor, controller logic means 40, coupled to the base electrode of switching transistor 14, selectively controls the turn-on and turn-off condition of switching transistor 14.

The protection circuitry for switching transistors 16 and 18 is substantially similar to that described for transistors 12 and 14, with the appropriate changes for the negative polarity of the second operating voltage −E at terminal 22. Accordingly, the protection circuitry for transistor 16 comprises serially connected zener breakdown device 42, current responsive device 44 and further diode means 46; the anode to cathode path of devices 42 and 44 and diode 46 are series connected together between the emitter and collector electrode of transistor 16. The common connection of zener diode 42 and current responsive device 44 is coupled through impedance 48 to a reference potential at +E volts. Protection circuitry for switching transistor 18 similarly comprises serially connected zener breakdown device 52, current responsive device 54 and further diode means 56; the anode to cathode paths of devices 52 and 54 and diode 56 are series connected between the emitter and collector electrodes of transistor 18. Controller logic means 50 and 60 selectively control the turn-on and turn-off condition of switching transistors 16 and 18 respectively.

In the operation of the circuit of FIG. 1, for example, a plurality of operating voltages, here being +E and −E, are selectively switched by first through fourth transistors, each transistor having a maximum voltage rating Vce substantially below the value for +E volts. As detailed in U.S. Pat. No. 4,210,826, selective turn-on of first and second, or third and fourth switching transistors provides an output voltage about equal to +E and −E volts respectively, while maintaining Vce for each transistor below ±E volts during normal operation of the switching circuitry. Selectively turning-on of second and third switching transistors 14 and 16 while concurrently turning off first and fourth switching transistors 12 and 18 clamps the output terminal through the gated transistors and either of diodes 62 or 64 to ground.

To insure reliable operation of the above-described switching circuitry and more particularly to avoid damaging the relatively high power switching transistors during transient or fault overload conditions in any of the conducting switching transistors, the aforedescribed protection circuit is provided for each of the first through fourth switching transistors. A voltage sensing circuit monitors a voltage Vce across the collector to emitter electrodes of each corresponding switching transistor to derive a first control signal whenever the collector to emitter voltage, Vce, is below a predetermined level, and a second control signal whenever Vce equals or exceeds the predetermined value. In a typical embodiment, the predetermined level of Vce corresponds to the maximum collector to emitter voltage rating for the particular switching transistor employed.

In a preferred embodiment, the voltage sensing circuitry comprises a zener diode serially coupled with a light emitting diode (LED) and a second diode between the collector and emitter electrodes of each switching transistor. The common connection of the zener and light emitting diodes is coupled through an impedance to a reference potential. For normal circuit operation, that is to say, when Vce for a conducting transistor is less than a predetermined maximum value for that transistor, a sufficient current magnitude flows through the light emitting diode (LED) to cause the LED to be illuminated. The LED is optically coupled to a controller logic circuit. The activated LED thus derives a first control signal, which corresponds to an allowable state for conduction through the respective switching transistor. Whenever the Vce equals or exceeds the predetermined value, the zener diode breaks down, permitting substantial current to flow through the zener diode, providing a low impedance bypass of the LED. In response to a lack of current flowing through the LED, the LED derives a second control signal in the functional operation of the controller logic means.

Referring to FIG. 2, there is shown a schematic diagram for a logic controller circuit operable in conjunction with the switching circuitry of FIG. 1 for selectively disabling control logics 30, 40, 50 and 60 in response to an overvoltage being developed between the emitter and collector of any of transistors 12, 14, 16 or 18. Controller transistors, 70, 72, 74 and 76, respectively associated with base drive means 78, 80, 82 and 84 are respectively responsive to the first controller signal of the protection circuits shunting transistors 12, 14, 16 and 18. The first controller signal derived from the protection circuits shunting transistors 12, 14, 16 and 18 respectively render the corresponding controller transistors 70, 72, 74 and 76 conductive. Controller transistors 70, 72, 74 and 76 are respectively rendered nonconducting in response to a second control signal being derived by the protection circuits shunting transistors 12, 14, 16 and 18. In a preferred embodiment, base drive means 78, 80, 82 and 84 each comprises a photodiode connected between the base of the associated controller transistor 70, 72, 74 and 76 and a source of voltage +v. The photodiodes in base drive means 78, 80, 82 and 84 are respectively optically coupled to light emitting diodes 24, 34, 44 and 54, whereby in response to the first control signal comprising the light signal from light emitting diode 24, 34, 44 or 54, the photodiode of the respective drive means 78, 80, 82 or 84 is rendered substantially conductive, applying a drive signal to the base of the respective controller transistor 70, 72, 74 or 76.

In a particular embodiment of the present invention, the four transistor switching amplifier of FIG. 1 selectively switches ±E volts between at least two input terminals and an output terminal. ±E volts exceeds the maximum allowable voltage (Vce) rating for any one of said four transistors 12, 14, 16 and 18. In the operation of this circuit, preferred operating states comprise:
 (a) Conduction through switching transistors 12 and 14 to provide an output terminal voltage of about +E volts;
 (b) Conduction through switching transistors 16 and 18 to provide an output terminal voltage of about −E volts;
 (c) Conduction through transistors 14 and 16 to clamp the output terminal to ground potential through diodes 62 and 64.

To ensure the aforedescribed operating states, the logic controller circuit of FIG. 2 couples serially connected first and second controller transistors 70 and 72 in parallel with serially connected third and fourth controller transistors 74 and 76. The parallel combination is coupled between a voltage source V and logic circuit input terminal 86. Diode 88, coupled between the above-described parallel combination, has a cathode electrode connected to the common connection point of the first and second controller transistors 70 and 72, and an anode electrode connected to the common connection point of the third and fourth controller transistors 74 and 76. Conditions (a) through (c), described heretofore, result in a "GO" signal ($\approx V$ volts less the appropriate transistor or diode voltage drops) being provided at terminal 86; the absence of conditions (a) through (c) results in a "NO GO" signal providing turn-off control of associated switching transistors 12.

In the operation of the logic control circuit, signal filtering means 90, comprising a parallel R-C filter to ground, minimizes false "GO" or "NO GO" signals to terminal 86, and in particular, minimizes unwanted "NO GO" signals in the interim between turning on and turning off of the respective switching transistors to satisfy conditions (a) through (c) recited heretofore.

Thus, in response to neither of transistors 12 nor 14, having an emitter collector overvoltage while being forward biased by control logic 30 and 40, voltage +E is correctly applied from terminal 20 to the output terminal. At this time, current flows from terminal 20 via the emitter collector path of transistor 12 through LED 24 and resistor 28 to ground, and current from terminal 20 flows through the emitter collector paths of transistors 12 and 14, LED 34 and resistor 38 to the terminal at voltage −E. Depending upon load conditions, some current may also flow from ground through diode 64, the emitter collector path of transistor 14, LED 34 and resistor 38 to the terminal at voltage −E. Simultaneously, no current flows through LED's 44 and 54 because there is no current path to these LED's as a result of transistors 16 and 18 being back biased by control logic 50 and 60.

In response to current flowing through LED's 24 and 34, diodes 78 and 80 conduct to apply forward bias voltages v of transistors 70 and 72. Thereby, the +V voltage at the collector of transistor 70 is applied to terminal 86 to indicate a "GO" condition. If, however, an overvoltage exists across the emitter collector paths of either of transistors 12 or 14 while the transistors are forward biased by control logics 30 and 40, LED 24 or 34 associated with the overvoltage transistor is deactivated. Thereby, the diode 78 or 80 associated with the deactivated LED 24 or 34 is cut off to remove forward bias from the associated transistor 70 or 72. The current path from +V at the collector of transistor 70 is open circuited, causing terminal 86 to be grounded.

Similar operations occur in response to transistors 16 and 18 being forward biased by control logic 50 and 60 to apply voltage −E from terminal 22 to the output terminal. If no overvoltage exists across the emitter collector paths of transistors 16 and 18, LED's 44 and 54 are energized to illuminate diodes 82 and 84, causing current to flow from the +V terminal to terminal 86, to produce a "GO" signal. If an overvoltage of transistor 16 or 18 occurs while the transistors are forward biased, LED 44 or 54 is deactivated, causing transistor 74 or 76 to cut off, whereby current does not flow from the +V terminal to terminal 86, whereby a "NO GO" signal is derived.

In response to control logics 40 and 50 forward biasing transistors 14 and 16 while control logics 30 and 60 back bias transistors 12 and 18, ground pontential is applied to the output terminal via diode 64 and the emitter collector path of transistor 14 and via diode 62 and the emitter collector path of transistor 16. With no overvoltage for the emitter collector path of transistor 14, current flows from ground through diode 64, the emitter collector path of transistor 14 and diode 34 to the negative voltage at terminal −E. A similar, but opposite path, is provided for current from terminal +E through LED 44, the emitter collector path of transistor 16 and diode 16 to ground. Thereby, LED's 34 and 44 are energized, causing diodes 80 and 82 to be forward biased, to provide a path from the +V terminal through the emitter collector paths of transistors 74 and 72 and diode 88 to terminal 86, causing derivation of a "GO" signal. If an overvoltage exists across the emitter collector path of transistor 14 or 16, one of transistors 72 or 74 is back biased, to prevent current flow from the +V terminal to terminal 86, whereby a "NO GO" signal is derived.

The "GO" and "NO GO" signals are coupled from terminal 86 to control logics 30, 40, 50 and 60. In response to the "GO" and "NO GO" signals, control logics 30, 40, 50 and 60 are respectively energized and de-energized in a normal manner.

The principles of operation of the circuitry of FIGS. 1 and 2 may be extended to a switching amplifier for reliably switching ±E volts using 2n stacked switching transistors, where n is an integer greater than 2. Referring to FIG. 3, there is shown a switching amplifier for switching ±E volts using six stacked switching transistors 100 through 105 inclusive. Each respective switching transistor is provided with a protection circuit substantially identical to those described for the transistor switching circuitry of FIG. 1, with appropriate bias for each of the overvoltage detecting circuits, whereby the overvoltage detecting circuits for transistors 100, 101, 102, 103, 104 and 105 are respectively biased at +E, ground, −3E, +3E, ground and −E. The protection circuit 106, described heretofore, comprises a zener diode 107, a light emitting diode 108 and a blocking diode 129, serially connected together between the emitter and collector electrodes, of each switching transistor.

Whenever the voltage between the collector and emitter electrodes of the switching transistor is below a predetermined level, Vce, a first level signal is provided to associated conroller circuitry permitting the respective switching transistor to remain conducting. Whenever Vce equals or exceeds the predetermined value, the protection circuit provides a second control signal to the associated controller circuit which, in turn, denies a base drive signal to the switching transistor, maintaining it in a non-conductive state. As illustrated for the protection circuit of switching transistor 100, light emitting diode 108 is optically coupled to controller circuit 112. Whenever Vce is below the predetermined value, there is sufficient current flowing through LED 108 to energize the LED into a light emitting state, which constitutes the first control signal. When Vce exceeds the predetermined value, zener diode 107 becomes substantially conductive. Current flows through the conducting zener diode while insufficient current flows through LED 108 to energize it into a light emitting state. The absence of the LED light signal constitutes the second control signal. In response to this second control signal, the controller logic circuit shuts down (turns off) the respective switching transistor, preventing burn-out thereof due to the excessive voltage condition.

Referring to FIG. 4, there is shown a controller logic circuit to be used in conjunction with the six transistor switching amplifier illustrated in FIG. 3. For each of the protection circuits of FIG. 3, there exists a corresponding responder circuit 120 comprising a voltage source v, a photodiode 122 and logic controller transistor 124. In response to the optical signal (first control signal) from LED 108 being derived, photodetector 122, optically coupled to the LED, is forward biased to couple voltage v to the base of transistor 124, whereby the transistor turned on. In the absence of the optical signal (second control signal) the controller transistor 124 is turned off.

The optical signals derived from overvoltage detectors 106 associated with transistors 100, 101, 102, 103, 104 and 105 are respectively coupled to responder circuits 120, 130, 140, 150, 160 and 170. In a manner similar to that described for the previous logic controller circuit a "GO" signal is provided by coupling the voltage at V terminal through three of circuits 120, 130, 140, 150, 160 and 170 to terminal 126 and further logic circuitry (not shown), whenever the following combinations of responder circuits are concurrently provided a first control signal by the corresponding protection circuit:

(a) 120, 130 and 140
(b) 150, 160 and 170
(c) 150, 130 and 140
(d) 150, 160 and 140

Thus, in normal operation, transistors 100–105 are activated by control logics 112 so at any one time three of the transistors are on and the other three transistors off to selectively switch voltages +3E, +E, −E and −3E to the output terminal at the common connection for transistors 102 and 103. The ±3E voltages are coupled to the output terminal in response to transistors 100–102 and 103–105 being respectively forward biased. The ±E voltages are coupled to the output terminal in response to transistors 101–103 and 102–104 being respectively forward biased. When transistors 100–105 are correctly forward biased with no overvoltage one of conditions (a), (b), (c) or (d) occurs and is detected by the circuit of FIG. 4.

In the absence of any of the concurrent conditions of (a), (b), (c), or (d), no path for the voltage at V terminal exists to terminal 126 whereby a "NO GO" signal is provided to terminal 126 and further logic circuitry.

Referring to FIG. 5, there is shown a segment of an n-transistor switching amplifier having the overload protection circuitry of the present invention. Each of the 1st through nth switching transistors is provided with a protection circuit 200, the arrangement and operation of which being described heretofore, to provide reliable switching of nE volts.

Thus, in the generalized case, there are 2n transistor switches, where n is an integer greater than one. Between switches n and (n+1) the output terminal is provided; in the four transistor embodiment of FIG. 1, where 2n=4 and n=2, the second (n) and third (n+1) transistors are respectively transistors 16 and 14; in the six transistor embodiment of FIG. 3, where 2n=6 and n=3, the third (n) and fourth (n+1) transistors are respectively transistors 103 and 102. Diode means connect a terminal between the main current paths of switches k and (k+1) to a predetermined voltage, where k selectively equals 1, 2–(2n−1), but is not equal to n. Thus, in the embodiment of FIG. 1, the diode means has reference to diodes 62 and 64 and transistors 18, 16 and 14 are respectively switches k=1, 2 and 3, and transistor 12 is switch (k+1). The control signals cause the main current paths of n of the switches to be simultaneously open and of the other n switches to be simultaneously closed such that during time interval 1 switches 1–n are closed, during time interval f switches f–(n+f−1) are closed . . . and during time interval g switches (n+1)–2n are closed.

With reference to FIG. 1, where g=3, during time interval 1 switches 18 and 16 are closed, during time interval 2 (f=2) transistors 16 (switch 2) and 14 (switch 2+2−1=3) are closed, and during time interval 3 switches 12 and 14 are closed. In the embodiment of FIG. 3, where g=4, and n=3, during time interval 1 switches 103–105 are closed to couple a d.c. voltage of −3E to the output terminal; during time interval 2 (f=2) transistors 104 (switch 2), 103 (switch 3) and 102 (switch 3+2−1=4) are activated into a conducting state to supply the voltage −E at the common terminals for transistors 102 and 102, as well as the common terminals for transistors 104 and 105, to the output terminal; during time interval 3 (f=3), transistors 103 (switch 3), 102 (switch 4) and 101 (switch 3+3−1=5) are activated to a conducting state to couple the voltage +E at the common terminals for transistors 100 and 101 and the common terminal for transistors 103 and 104 to the output terminal; and during time interval 4, transistors 100–102 are activated to the conducting state to couple voltage +3E to the output terminal.

The previously mentioned relationship concerning coupling to the voltages to the output terminals in the embodiments of FIGS. 1 and 3 is provided by diode means (diodes 62, 64, FIG. 1 or the diodes connected to the +E and −E d.c. sources to the right of FIG. 3) which are poled and connected to predetermined voltages (ground in FIG. 1 or ±E in FIG. 3) such that during time intervals 1 and g the voltages at the first and second voltage source terminals (±E, FIG. 1 or ±E, FIG. 3) are respectively coupled to the output terminal and during time interval f voltages of the same polarity and magnitude (ground in FIG. 1 or −E in FIG. 3 during interval 2 or +E in FIG. 3 during interval 3) are coupled to the output terminal from a common terminal between switches h and (h+1) (transistor 14 in FIG. 1 during interval 2 or transistors 105 and 104 during interval 2 or transistors 104 and 103 during interval 3) and from a common terminal between switches (h+n) and (h+1+n), (transistor 16 in FIG. 1 during interval 2 or transistors 102 and 101 in FIG. 3 during interval 2 or transistors 101 and 100 during interval 3) where f is each of the intervals except 1 and g, and h is selectively every integer from 1 to (n−1).

In the FIG. 1 embodiment, h=1 refers to transistor 18, (h+1=1+1) refers to transistor 6, (h+n=1+2=3) refers to transistor 14, and (h+n+1=1+2+1=4) refers to transistor 12. In the FIG. 1 embodiment, the only value for h is unity because h is selectively every integer from 1 to (n−1=2−1=1). In the FIG. 3 embodiment, the possible values for h are 1 and 2. For h=1, switch h is transistor 105; switch (h+1) is transistor 104; switch (h+n) is transistor 102; switch (h+n+1) is transistor 101. For h=2 in FIG. 3, switch h is transistor 104; switch h+1 is transistor 103; switch (h+n) is transistor 101; and switch (h+n+1) is transistor 100.

The voltage magnitude coupled to the diode means is the voltage difference between the first and second terminals, so that in FIG. 1 the voltage magnitude is zero and in FIG. 3 the voltage magnitude is −E or +E, depending on the diode. A separate means detects an overvoltage across the main current path of switch m, where m is selectively integer from 1 to 2n (in FIG. 1 switch m is each of transistors 12, 14, 16 and 18, in FIG. 3 switch m is each of transistors 100–105).

What is claimed is:

1. A bipolar nonlinear switching amplifier, comprising:

first through fourth like conductivity transistor switch means having a main current conduction path connected serially, each having a base, collector, and emitter electrodes;

a source of voltage $E_1$ being applied to a first end of said serial combination, a second source of voltage $E_2$ being applied to a remaining end of said serial combination;

an output terminal connected to the common connection of said second and third transistor switch means;

diode means coupled to a common connection of the emitter and collector of the first and second transistor switch means and the third and fourth transistor switch means;

voltage sensing means for each respective transistor of the first and second transistor switch means and the third and fourth transistor switch means, responsive to a voltage Vce developed between the emitter and collector electrodes of a respective transistor, each said sensing means providing a first control signal whenever said voltage Vce is less than a predetermined value and providing a second control signal whenever said voltage Vce is equal to or greater than said predetermined voltage;

logic controller means, operable for selectively providing a drive signal to the base electrode of each transistor switch means rendering it substantially conductive upon a concurrent condition of:

(a) a first control signal being provided for a respective transistor and (b) conduction through one other of said first through fourth transistor switch means providing a voltage at said output terminal about equal to either $E_1$ or $E_2$.

2. The amplifier of claim 1 wherein said voltage sensing means includes a voltage breakdown device and a current responsive device serially coupled in parallel relation to the main current conduction path of each respective transistor switch means, where for said first and fourth transistor switch means a common connection point of said breakdown device and said current responsive device is coupled through an impedance to a ground potential and where for said second and said third transistor switch means, a common connection point of said breakdown device and said current responsive device is coupled through an impedance to a ground potential and where for said third transistor switch means, a common connection point of said breakdown device and said current responsive device is coupled through an impedance to a source of voltage comprising voltage $E_1$ for said third transistor switch and said voltage $E_2$ for said second transistor.

3. The amplifier of claim 2 wherein said voltage breakdown means comprises a zener diode and said current responsive means comprises a light emitting diode.

4. The amplifier of claim 3 wherein said first control signal comprises an optical signal generated by a sufficient current through said light emitting diode, optically coupled to said control logic means; and, wherein, said second control signal comprises the absence of said optical signal for the concurrent condition of a breakdown of said zener diode and insufficient current flowing through said light emitting diode to illuminate same.

5. A circuit for selectively switching a plurality of voltage levels to an output terminal comprising 2n semiconductor switches having main current paths series connected between first and second voltage source terminals having a potential difference of 2 nE volts between them, where n is an integer greater than 1, each of said switches having a control electrode responsive to a control signal having first and second states respectively causing the main current path of the switch to be open and closed, each of said switches having an overvoltage rating across the main current path thereof less than 2 nE volts, an output terminal between switches n and (n+1), diode means connecting a terminal between the main current paths of switches k and (k+1) to a predetermined voltage, where k selectively equals 1, 2,–(2n−1) but is not equal to n, the control signals causing the main current paths of n of the switches to be simultaneously open and of the other n switches to be simultaneously closed such that during time interval 1 switches 1–n are closed, during time interval f switches f–(n+f−1) are closed, and during time interval g switches (n+1)–2n are closed, where f is each of the intervals except 1 and g and g is at least 3, the diode means being poled and the predetermined voltages being such that during time intervals 1 and g the voltages at the first and second voltage source terminals are respectively coupled to the output terminal and during time interval f voltages of the same polarity and magnitude are coupled to the output terminal from a common terminal between switches h and (h+1) and from a common terminal between switches (h+n) and (h+1+n) where h is selectively every integer from 1 to (n−1), the voltage magnitude having a value between the value of the voltage difference between the first and second terminals, a separate means for detecting an overvoltage across the main current path of each switch m, where m is selectively every integer from 1 to 2n, and means responsive to the 2n detecting means for deriving an indication of an overvoltage subsisting across one of the switches responsive to the second state of the control signal.

6. The circuit of claim 5 wherein said detecting means for switch m includes a series circuit comprising a voltage breakdown means series connected with a current responsive signalling device, the series circuit being in shunt with the main current path of switch m, a terminal applying a bias potential between the breakdown means and the current responsive signalling means; the bias voltage, the voltages at the first and second terminals, the predetermined voltage magnitude and polarity, the diode means, the overvoltages, and the breakdown means being such that for the voltage across the main current path of switch m being (a) less than the overvoltage across the main current path of switch m, the breakdown means of detector means m does not break down and current flows through the signalling device of detector means m, and (b) greater than the overvoltage across the main current path of switch m, the breakdown means of detector m breakdowns and current does not flow through the signalling device.

7. The circuit of claim 6 wherein detector means m includes a unidirectional conducting element in a branch including the sensor, said unidirectional conducting element being poled so current flows through it from the main current path of transistor m to the bias potential applying terminal while the breakdown means of detector is not in a breakdown condition.

8. The circuit of claim 6 or 7 wherein the breakdown means of detector m comprises a zener diode poled to conduct breakdown current in the same direction relative to the bias potential terminal of detector m that current flows through the main current path of switch m while the control electrode of switch m is responsive to a control signal having the second state.

9. The circuit of claim 8 wherein the sensor of detector m comprises a light emitting diode poled to pass current between the bias potential terminal of detector m and the main current path of switch m while switch m is responsive to a control signal having the second state.

10. The circuit of claim 8 wherein the sensor of detector m comprises a light emitting diode poled to pass current between the bias potential terminal of detector m and the main current path of switch m while switch m is responsive to a control signal having the second state, and a diode connected in series with and poled in the same direction as the light emitting diode of detector m.

11. The circuit of claim 5, 6 or 7 wherein n=2.

12. The circuit of claim 5, 6 or 7 wherein n=3.

13. The circuit of claim 5, 6 or 7 wherein said indication deriving means includes 2n switching devices connected in first and second parallel branches between a voltage input terminal and a signal output terminal, each of said branches including n of the switching devices connected in series with each other, switching device m being coupled with the signalling device of detecting means m so switching device m is closed in response to detecting means m not detecting an overvoltage across the main current path of switch m, and unidirectional current conducting means connected between the switching devices of the two branches to provide a current path between the voltage input and signal output terminals in response to different combinations of n of the switching devices being closed in response to no overvoltage being sensed by the 2n detecting means for each of the different sequences.

14. The circuit of claim 13 wherein overvoltage detecting means m includes a light source selectively activated to a light emitting state in response to an overvoltage subsisting across the main current path of switch m, switching device m including light sensor means responsive to light from the light source of detecting means m for causing switching device m to be respectively closed and opened in resonse to no overvoltage and the presence of an overvoltage across the main current path of switch m.

15. The circuit of claim 5, 6, or 7 wherein said indication deriving means includes 2n switching devices connected in first and second parallel branches between a voltage input terminal and a signal output terminal, each of said branches including n of the switching devices connected in series with each other, switching device m being coupled with the signalling device of detecting means m so switching device m is closed in response to detecting means m not detecting an overvoltage across the main current path of switch m, and unidirectional current conducting means connected between the switching devices of the two branches to provide a current path between the voltage input and signal output terminals in response to different combinations of n of the switching devices being closed in response to no overvoltage being sensed by the 2n detecting means for each of the different sequences, the breakdown means of detector m being a zener diode poled to conduct breakdown current in the same direction relative to the bias potential terminal of detector m that current flows through the main current path of switch m while the control electrode of switch m is responsive to a control signal having the second state, the sensor of detector m being a light emitting diode poled to pass current between the bias potential terminal of detector m and the main current path of switch m while switch m is responsive to a control signal having the second state, switching device m including light sensor means responsive to light from the light emitting diode of detecting means m for causing switching device m to be respectively closed and open in resonse to the light emitting diode of detecting means m emitting and not emitting light.

16. A circuit for selectively switching a plurality of voltage levels to an output terminal comprising 2n semiconductor switches having main current paths series connected between first and second voltage source terminals having a potential difference of 2 nE volts between them, where n is an integer greater than 1, each of said switches having a control electrode responsive to a control signal having first and second states respectively causing the main current path of the switch to be open and closed, each of said switches having an overvoltage rating across the main current path thereof less than 2 nE volts, an output terminal between switches n and (n+1), diode means connecting a terminal between the main current paths of switches k and (k+1) to a predetermined voltage, where k selectively equals 1, 2,−(2n−1) but is not equal to n, the control signals causing the main current paths of n of the switches to be simultaneously open and of the other n switches to be simultaneously closed such that during time interval 1 switches 1−n are closed, during time interval f switches f−(n+f−1) are closed and during time interval g switches (n+1)−2n are closed, where f is each of the intervals except 1 and g and g is at least 3, the diode means being poled and the predetermined voltages being such that during time intervals 1 and g the voltages at the first and second voltage source terminals are respectively coupled to the output terminal and during time interval f voltages of the same polarity and magnitude are coupled to the output terminal from a common terminal between switches h and (h+1) and from a common terminal between switches (h+n) and (h+1+n) where h is selectively every integer from 1 to (n−1), the voltage magnitude having a value between the value of the voltage difference between the first and second terminals, a separate means for detecting an overvoltage across the main current path of switch m, where m is selectively every integer from 1 to 2n, said detecting means for switch m including a series circuit comprising a voltage breakdown means series connected with a current responsive signalling device, the series circuit being in shunt with the main current path of switch m, a terminal applying a bias potential between the breakdown means and the current responsive signalling means; the bias voltage, the voltages at the first and second terminals, the predetermined voltage magnitude and polarity, the diode means, the overvoltages, and the breakdown means being such that for the voltage across the main current path of switch m being (a) less than the overvoltage across the main current path of switch m, the breakdown means of detector means m does not break down and current flows through the signalling device of detector means m, and (b) greater than the overvoltage across the main current path of switch m, the breakdown means of detector m breakdowns and current does not flow through the signalling device.

17. The circuit of claim 16 wherein detector means m includes a unidirectional conducting element in a branch including the sensor, said unidirectional conducting element being poled so current flows through it from the main current path of transistor m to the bias potential applying terminal while the breakdown means of detector is not in a breakdown condition.

18. The circuit of claim 16 or 17 wherein the breakdown means of detector m comprises a zener diode poled to conduct breakdown current in the same direction relative to the bias potential terminal of detector m that current flows through the main current path of switch m while the control electrode of switch m is responsive to a control signal having the second state.

19. The circuit of claim 18 wherein the sensor of detector m comprises a light emitting diode poled to pass current between the bias potential terminal of detector m and the main current path of switch m while switch m is responsive to a control signal having the second state.

20. The circuit of claim 18 wherein the sensor of detector m comprises a light emitting diode poled to pass current between the bias potential terminal of detector m and the main current path of switch m while switch m is responsive to a control signal having the second state, and a diode connected in series with and poled in the same direction as the light emitting diode of detector m.

21. The circuit of claim 16 or 17 wherein n=2.

22. The circuit of claim 16 or 17 wherein n=3.

* * * * *